US012755074B2

(12) United States Patent
Zhao

(10) Patent No.: US 12,755,074 B2
(45) Date of Patent: Oct. 6, 2026

(54) CALCULATION METHOD, MEDIUM AND SYSTEM FOR REAL-TIME PHYSICAL ENGINE ENHANCEMENT BASED ON NEURAL NETWORK

(71) Applicant: Fengping Zhao, Shanghai (CN)

(72) Inventor: Fengping Zhao, Shanghai (CN)

( * ) Notice: Subject to any disclaimer, the term of this patent is extended or adjusted under 35 U.S.C. 154(b) by 994 days.

(21) Appl. No.: 17/989,658

(22) Filed: Nov. 17, 2022

(65) Prior Publication Data

US 2023/0086956 A1 Mar. 23, 2023

Related U.S. Application Data

(63) Continuation-in-part of application No. 17/216,168, filed on Mar. 29, 2021, now abandoned.

(30) Foreign Application Priority Data

Jun. 28, 2020 (CN) ......................... 202010599509.8

(51) Int. Cl.
*G06F 30/27* (2020.01)
*G06F 30/15* (2020.01)
(Continued)

(52) U.S. Cl.
CPC .............. *G06F 30/27* (2020.01); *G06F 30/15* (2020.01); *G06F 30/20* (2020.01); *G06F 30/25* (2020.01);
(Continued)

(58) Field of Classification Search
None
See application file for complete search history.

(56) References Cited

U.S. PATENT DOCUMENTS 6,195,625 B1 * 2/2001 Day ......................... G06T 19/20 703/7
9,047,770 B2 * 6/2015 Lafon ...................... G08G 5/51
(Continued)

FOREIGN PATENT DOCUMENTS

CN 111814970 A * 10/2020 ............. G06F 30/27

OTHER PUBLICATIONS

García, Ignacio, et al. "A neural network approach for real-time collision detection." IEEE international conference on systems, man and cybernetics. 5 Pages, vol. 5. IEEE, 2002. (Year: 2002).*
(Continued)

*Primary Examiner* — Akash Saxena
(74) *Attorney, Agent, or Firm* — Bayramoglu Law Offices LLC

(57) ABSTRACT

A calculation method for real-time physical engine enhancement based on a neural network includes: dynamically constructing a multi-layer and multi-surface pre-collision shell according to key concave and convex vertices of an object to be subjected to collision detection; obtaining an initial collision detection correspondence matrix according to the multi-layer and multi-surface pre-collision shell; and setting a collision detection condition, inputting a relevant parameter of the collision detection condition into the neural network for parameter screening, and determining whether a collision condition satisfies a safety condition after the parameter screening. When the collision condition satisfies the safety condition, a collision detection correspondence matrix is not updated. When the collision condition does not satisfy the safety condition, the matrix is updated, and the multi-layer and multi-surface pre-collision shell is reconstructed according to the updated matrix. A calculation system for the real-time physical engine enhancement based on a neural network is further provided.

13 Claims, 3 Drawing Sheets

(51) Int. Cl.
*G06F 30/20* (2020.01)
*G06F 30/25* (2020.01)

(52) U.S. Cl.
CPC .......................... *G06T 2207/20084* (2013.01); *G06T 2210/21* (2013.01); *G06T 2219/2021* (2013.01)

(56) References Cited

U.S. PATENT DOCUMENTS

| | | | | |
|---|---|---|---|---|
| 10,410,439 | B1 * | 9/2019 | Gingrich | G01N 29/069 |
| 10,672,389 | B1 * | 6/2020 | Abeloe | G06N 3/006 |
| 12,247,895 | B1 * | 3/2025 | Liu | G01M 17/0078 |
| 12,450,818 | B2 * | 10/2025 | Perry | G06N 3/02 |
| 2004/0073385 | A1 * | 4/2004 | Miyamoto | G01L 5/00 702/44 |
| 2004/0107080 | A1 * | 6/2004 | Deichmann | A61F 11/08 703/6 |
| 2010/0114633 | A1 * | 5/2010 | Sislak | G06Q 10/047 701/120 |
| 2019/0043214 | A1 * | 2/2019 | Chilcote-Bacco | G06T 7/70 |
| 2019/0073826 | A1 * | 3/2019 | Bailey | G06T 17/205 |
| 2020/0273228 | A1 * | 8/2020 | Lewin | A63F 13/42 |
| 2020/0364469 | A1 * | 11/2020 | Fowe | G01C 21/3867 |
| 2020/0398120 | A1 * | 12/2020 | Shimizu | G09B 19/0038 |
| 2021/0241616 | A1 * | 8/2021 | Abdulhai | G08G 1/052 |
| 2021/0319209 | A1 * | 10/2021 | Deng | G06N 3/084 |
| 2021/0370180 | A1 * | 12/2021 | Carraway | A63F 13/497 |
| 2021/0378793 | A1 * | 12/2021 | Akopov | G16H 20/30 |
| 2021/0406432 | A1 * | 12/2021 | Zhao | G06F 30/27 |
| 2022/0319096 | A1 * | 10/2022 | Perry | G06N 3/02 |
| 2023/0086956 | A1 * | 3/2023 | Zhao | G06F 30/20 703/8 |
| 2024/0037827 | A1 * | 2/2024 | Zhou | G06T 13/40 |
| 2024/0062468 | A1 * | 2/2024 | Ueda | G06T 17/20 |
| 2024/0116501 | A1 * | 4/2024 | Park | B60W 30/095 |

OTHER PUBLICATIONS

Chen, G., Li, T., Chen, Q. et al. Application of deep learning neural network to identify collision load conditions based on permanent plastic deformation of shell structures. Comput Mech 64, 435-449 (2019). https://doi.org/10.1007/s00466-019-01706-2 (Year: 2019).*

* cited by examiner

CALCULATION METHOD, MEDIUM AND SYSTEM FOR REAL-TIME PHYSICAL ENGINE ENHANCEMENT BASED ON NEURAL NETWORK

CROSS REFERENCE TO THE RELATED APPLICATIONS

This application is a continuation-in-part (CIP) application of U.S. non-provisional application Ser. No. 17/216,168 filed on Mar. 29, 2021, which claims priority to Chinese Patent Application No. 202010599509.8, filed on Jun. 28, 2020, the entire contents of which are incorporated herein by reference.

TECHNICAL FIELD

The present invention relates to the physical field, in particular to a system, medium and method based on a neural network. More particularly, the present invention relates to a system, medium and method for real-time physical engine enhancement based on a neural network.

BACKGROUND

In the field of engineering mechanics, driving simulation, material simulation, virtual dressing into clothing to confirm a fit and the like, physical engines are used to achieve approaching real world results by means of simulating a scene following Newton's laws of motion and Newton's law of universal gravitation. There are many physical models employed in simulating a physical engine, wherein the real-time collision detection is one of the most common algorithms. It is most time-consuming and closely related to the area and number of triangles on the surfaces of multiple objects to be collided.

At present, the collision is usually calculated by using the distance between the point and the surface. However, when the area of the surface increases or the density of the fixed point is large, the calculating time will increase, and the real-time physical engine needs to continuously train the collision detection. Although high-density parallel computation can be achieved with the assistance of specific hardware calculators, the density of the point and the surface and the density of calculating hardware are bound to be increased, resulting in a relatively large amount of calculations.

After searching the literature and patents, it is found that Chinese patent, titled Physical Collision Prediction Method and Device (publication number CN105469424A, published Apr. 6, 2016) discloses a physical collision prediction method. In the technical solution disclosed in this patent document, the method includes the following steps: obtaining motion state data of an object; obtaining sequence information of a collision path and sequence information of a collision reaction according to the motion state data of the object; deducing the motion of the object according to a predefined motion deduction rule of the object, the sequence information of the collision path and the sequence information of the collision reaction.

The Chinese patent, titled Method for Object Collision Detection in Large-scale Scenes (publication number CN104766371A, published Jul. 8, 2015) discloses a method for object collision detection in large-scale scenes. In the technical solution disclosed in this patent document, the calculation amount of collision detection is reduced by establishing the axis-aligned bounding box (AABB), performing dimension reduction processing, obtaining dynamic lists and calculating collision detection, thereby accelerating the real-time rendering efficiency of the physical engine.

The above patents do not teach how to use the algorithm based on the neural network to realize a real-time physical engine enhancement. Therefore, it is desirable to develop a system, medium and method for real-time physical engine enhancement to solve the shortcomings of the prior arts, achieve efficient calculation of the physical collision and obtain optimal simulation results.

SUMMARY

In view of the shortcomings in the prior art, the objective of the present invention is to provide a calculation method, medium and system for real-time physical engine enhancement based on a neural network.

In order to realize the objective of the present invention, the present invention provides a calculation method for real-time physical engine enhancement based on a neural network, including the following steps:

- a multi-layer and multi-surface pre-collision shell constructing step: dynamically constructing a multi-layer and multi-surface pre-collision shell according to key concave and convex vertices of an object to be subjected to collision detection;
- a relation matrix acquisition step: obtaining an initial collision detection correspondence matrix according to the multi-layer and multi-surface pre-collision shell; and
- a screening and determining step: setting a collision detection condition, inputting a relevant parameter of the collision detection condition into the neural network for parameter screening, and determining whether a collision condition satisfies a safety condition after screening.

When the collision condition satisfies the safety condition, a collision detection correspondence matrix is not updated.

When the collision condition does not satisfy the safety condition, a current collision detection correspondence matrix is updated, and the multi-layer and multi-surface pre-collision shell constructing step is triggered according to the updated collision detection correspondence matrix to reconstruct the multi-layer and multi-surface pre-collision shell.

Preferably, in the calculation method for the real-time physical engine enhancement based on the neural network according to the present invention, the screening and determining step includes:

- obtaining a developing velocity of a collision and an angle in each direction by calculating a distance between objects of the collision and a time when the collision occurs to obtain vertices of the moment T after the collision occurs, and deducing a developing displacement of vertices of the moment T+1;
- marking and extracting vertices with a Euclidean distance smaller than a collision warning distance to obtain marked vertices, wherein the Euclidean distance is between the vertices of the moment T and the vertices of the moment T+1;
- constructing triangular surfaces according to the marked vertices, and marking and extracting triangular surfaces with a distance smaller than the collision warning distance to obtain marked vertex faces, wherein the distance is between the surfaces; and using the neural network to calculate and obtain a correspondence matrix of a distance change of each marked vertex according to a set safety distance, positions and displacements of each marked vertex at the moment T−1 and the moment T−2 before the collision occurs, and determining whether the distance change satisfies the warning distance. When the distance change satisfies the warning distance, it is considered that the collision condition satisfies the safety condition. When the distance change does not satisfy the warning distance, it is considered that the collision condition does not satisfy the safety condition.

Preferably, in the calculation method for the real-time physical engine enhancement based on the neural network according to the present invention, the multi-layer and multi-surface pre-collision shell includes a first outer pre-collision shell layer, a sub-surface pre-collision shell layer, and a collision detection layer, wherein the first outer pre-collision shell layer, the sub-surface pre-collision shell layer, and the collision detection layer are arranged successively from outside to inside, and a distance between the sub-surface pre-collision shell layer and the first outer pre-collision shell layer is smaller than a distance between the collision detection layer and the first outer pre-collision shell layer.

The number of vertices and the number of surfaces of the sub-surface pre-collision shell layer are more than the number of vertices and the number of surfaces of the first outer pre-collision shell layer, and the number of vertices and the number of surfaces of the collision detection layer are more than the number of vertices and the number of surfaces of the sub-surface pre-collision shell layer.

The moment when the sub-surface pre-collision shell layer of an object is collided by vertices of the first outer pre-collision shell layer of another object is defined as the moment T, and the vertices of the first outer pre-collision shell layer of another object are defined as the vertices of the moment T.

The velocity vector of the vertices of the moment T has a velocity sub-vector moving toward the object.

Preferably, in the calculation method for the real-time physical engine enhancement based on the neural network according to the present invention, the relevant parameter of the collision detection condition includes at least one selected from the group of a collision distance, a collision velocity, a shape of a collision body, the number of surfaces of the collision body, and a safety distance.

Correspondingly, in order to achieve the above objective, the present invention further provides a computer-readable storage medium in which a computer program is stored. The computer program is configured to be processed and executed by a processor to implement the steps of the calculation method for the real-time physical engine enhancement based on the neural network mentioned above.

The term "computer-readable media" or "computer-readable medium" as used herein refers to any media/medium that participates in providing instructions to the processor for execution. Such a medium may take many forms, including but not limited to non-volatile media, volatile media, and transmission media. Non-volatile media may include, for example, optical or magnetic disks. Volatile media may include a dynamic memory. Transmission media may include coaxial cables, copper wire and fiber optics. Transmission media may also take the form of acoustic, optical, or electromagnetic waves, such as those generated during Radio Frequency (RF) and infrared (IR) data communications. Common forms of computer-readable media may include, for example, a floppy disk, a flexible disk, hard disk, magnetic tape, any other magnetic medium, a CD-ROM, a Compact Disc-Rewritable (CDRW), a Digital Video Disk (DVD), any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Moreover, in order to realize the above objective, the present invention further provides a calculation system for real-time physical engine enhancement based on a neural network, including:

a multi-layer and multi-surface pre-collision shell constructing module, configured to dynamically construct a multi-layer and multi-surface pre-collision shell according to key concave and convex vertices of an object to be subjected to collision detection;

a relation matrix acquisition module, configured to obtain an initial collision detection correspondence matrix according to the multi-layer and multi-surface pre-collision shell; and a screening and determining module, configured to set a collision detection condition, input a relevant parameter of the collision detection condition into the neural network for parameter screening, and determine whether a collision condition satisfies a safety condition after screening.

When the collision condition satisfies the safety condition, a collision detection correspondence matrix is not updated.

When the collision condition does not satisfy the safety condition, a current collision detection correspondence matrix is updated, and a multi-layer and multi-surface pre-collision shell constructing step is triggered according to the updated collision detection correspondence matrix to reconstruct the multi-layer and multi-surface pre-collision shell.

Preferably, in the calculation system for the real-time physical engine enhancement based on the neural network according to the present invention, the screening and determining module is further configured to:

obtain a developing velocity of a collision and an angle in each direction by calculating a distance between objects of the collision and a time when the collision occurs to obtain vertices of the moment T after the collision occurs, and deduce a developing displacement of vertices of the moment T+1;

mark and extract vertices with a Euclidean distance smaller than a collision warning distance to obtain marked vertices, wherein the Euclidean distance is between the vertices of the moment T and the vertices of the moment T+1;

construct triangular surfaces according to the marked vertices, and mark and extract triangular surfaces with a distance smaller than the collision warning distance to obtain marked vertex faces, wherein the distance is between the surfaces; and use the neural network to calculate and obtain a correspondence matrix of a distance change of each marked vertex according to a set safety distance, positions and displacements of each marked vertex at the moment T−1 and the moment T−2 before the collision occurs, and determine whether the distance change satisfies the warning distance. When the distance change satisfies the warning distance, it is considered that the collision condition satisfies the safety condition. When the distance change does not satisfy the warning distance, it is considered that the collision condition does not satisfy the safety condition.

Preferably, in the calculation system for the real-time physical engine enhancement based on the neural network according to the present invention, the multi-layer and multi-surface pre-collision shell includes a first outer pre-collision shell layer, a sub-surface pre-collision shell layer, and a collision detection layer, wherein the first outer pre-collision shell layer, the sub-surface pre-collision shell layer, and the collision detection layer are arranged successively from outside to inside, and a distance between the sub-surface pre-collision shell layer and the first outer pre-collision shell layer is smaller than a distance between the collision detection layer and the first outer pre-collision shell layer.

Preferably, in the calculation system for the real-time physical engine enhancement based on the neural network according to the present invention, the number of vertices and the number of surfaces of the sub-surface pre-collision shell layer are more than the number of vertices and the number of surfaces of the first outer pre-collision shell layer, and the number of vertices and the number of surfaces of the collision detection layer are more than the number of vertices and the number of surfaces of the sub-surface pre-collision shell layer.

The moment when the sub-surface pre-collision shell layer of an object is collided by vertices of the first outer pre-collision shell layer of another object is defined as the moment T, and the vertices of the first outer pre-collision shell layer of another object are defined as the vertices of the moment T.

The velocity vector of the vertices of the moment T has a velocity sub-vector moving toward the object.

Preferably, in the calculation system for the real-time physical engine enhancement based on the neural network according to the present invention, the relevant parameter of the collision detection condition includes at least one selected from the group of a collision distance, a collision velocity, a shape of a collision body, the number of surfaces of the collision body, and a safety distance.

Compared with the prior art, the calculation method, medium and system for the real-time physical engine enhancement based on the neural network according to the present invention have the following advantages.

1. The calculation method for the real-time physical engine enhancement based on the neural network according to the present invention can accelerate the computation of the real-time physical collision under limited mobile intelligent hardware resources through reasonable modeling.

2. The calculation method for the real-time physical engine enhancement based on the neural network according to the present invention can realize fast, accurate and high-efficiency computation of the physical collision by reasonably selecting vertices, which can greatly improve the density of the point and the surface and the density of computers.

3. The calculation method for the real-time physical engine enhancement based on the neural network according to the present invention can effectively shorten the calculation time, and acts as an application guide for the fields of engineering mechanics, driving simulation, and material simulation.

BRIEF DESCRIPTION OF THE DRAWINGS

By reading the detailed description of the non-restrictive embodiments with reference to the following drawings, other features, objectives and advantages of the present invention will become more obvious.

DETAILED DESCRIPTION OF THE EMBODIMENTS

The present invention is described in detail in combination with specific embodiments. The following embodiments will help those skilled in the art to further understand the present invention but do not limit the present invention in any form. It should be pointed out that some modifications and improvements may be made by those having ordinary skill in the art without departing from the idea of the present invention, but all these modifications and improvements shall fall within the scope of protection of the present invention.

In the various embodiment of the instant invention, the term "shell" refers to a three-dimensional (3D) computer model (i.e. an electronic model) for simulating a physical object of a motor vehicle.

Embodiment I

Figure 1:
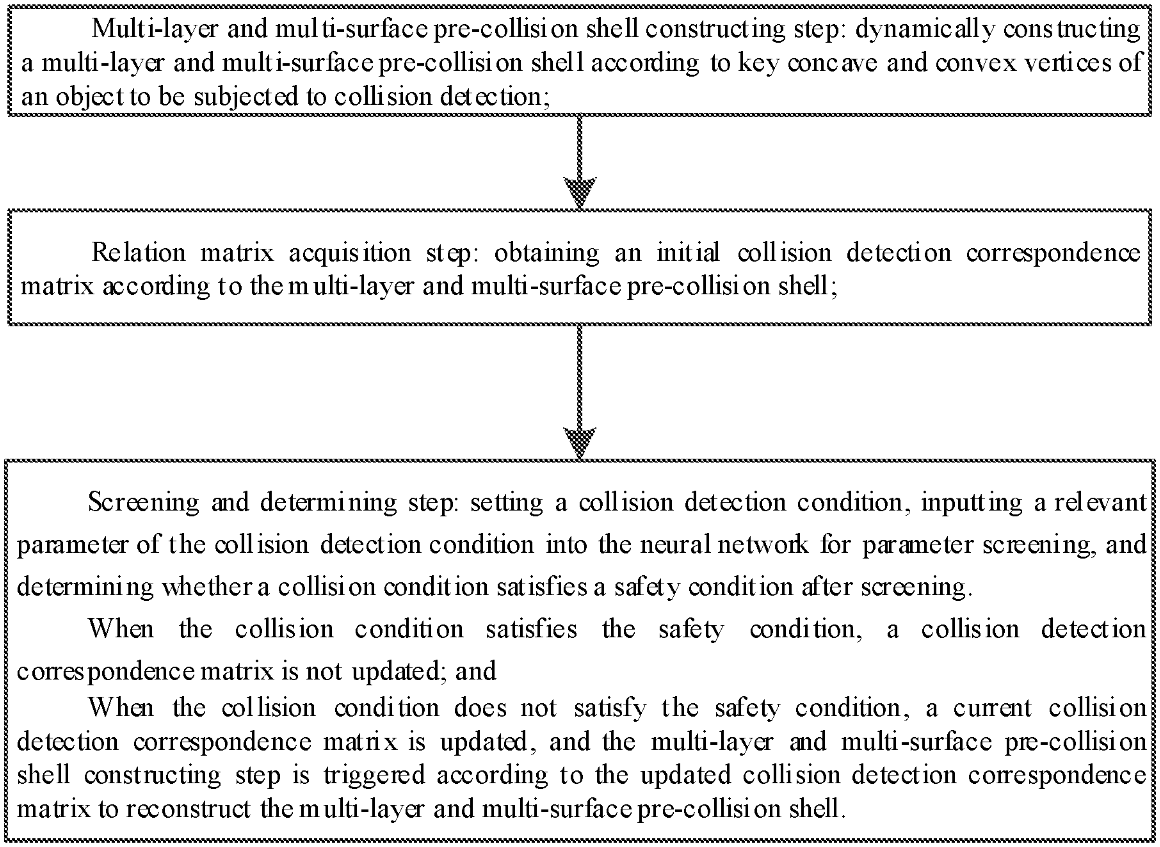
FIG. 1 schematically shows a flow chart of a calculation method for real-time physical engine enhancement based on a neural network according to an embodiment of the present invention.

FIG. 1 schematically shows a flow chart of a calculation method for real-time physical engine enhancement based on a neural network according to Embodiment I of the present invention.

As shown in FIG. 1, in this embodiment, the calculation method of the real-time physical engine enhancement based on the neural network includes the following steps.

Multi-layer and multi-surface pre-collision shell constructing step: a multi-layer and multi-surface pre-collision shell is dynamically constructed according to key concave and convex vertices of an object to be subjected to collision detection.

To be more specific, the multi-layer and multi-surface pre-collision shell contains three-dimensional coordinates of the vertices of corresponding outer surfaces of the three-dimensional object. Each layer of the shell describes a layer of vertices of the three-dimensional object, and is recorded in a matrix format as:

$$\text{Shell}_1 = \{V_1(X_1, Y_1, Z_1), V_2(X_2, Y_2, Z_2), \ldots, V_n(X_n, Y_n, Z_n)\}$$

wherein $Shell_1$ is a first layer of a shell, $V_1 \ldots V_n$ each represents a vertex of the three-dimensional physical object, and $X_1 \ldots X_n$, $Y_1 \ldots Y_n$, and $Z_1 \ldots Z_n$, are the spatial coordinates of the vertices.

Figure 5:
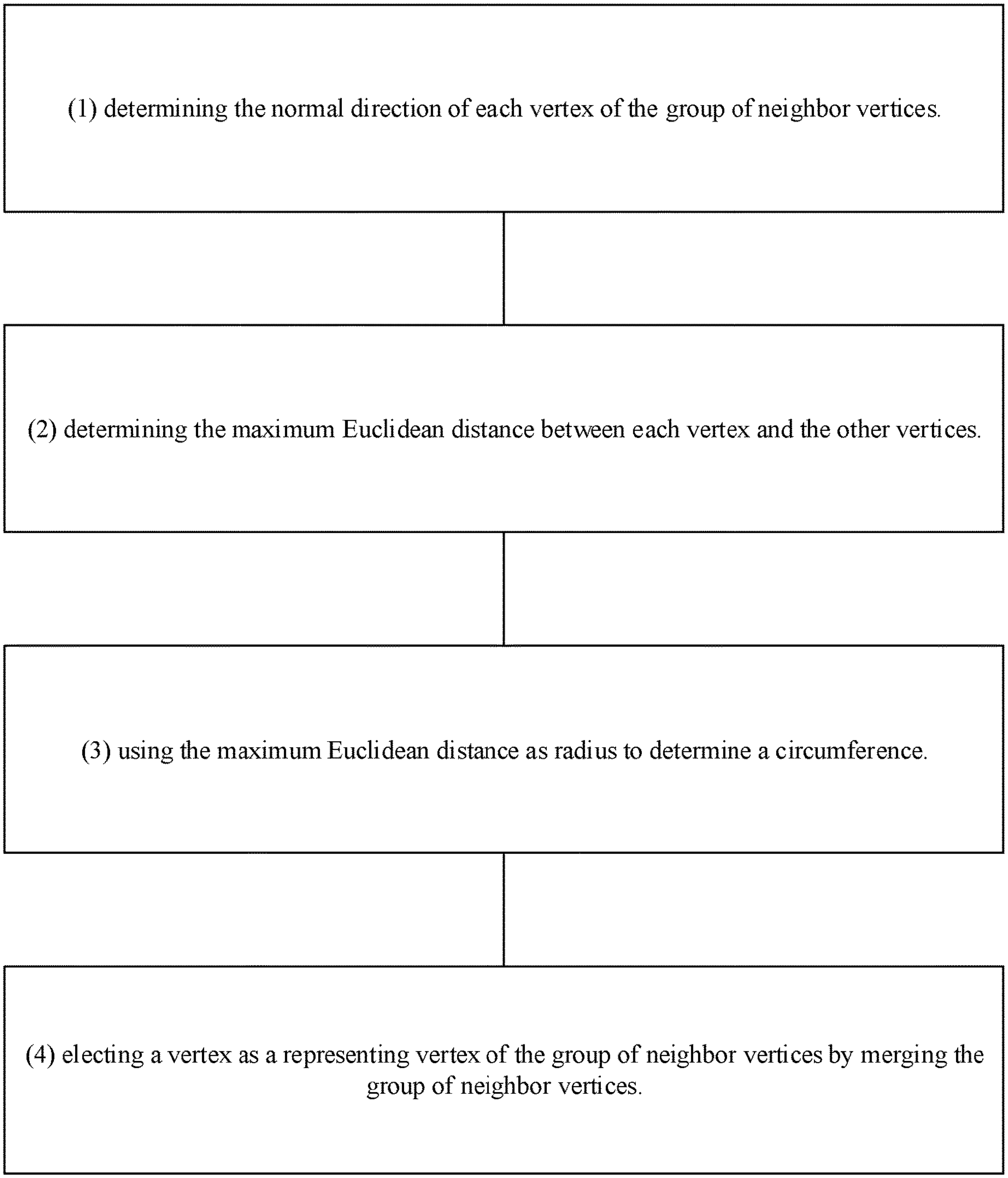
FIG. 5 illustrates a flowchart showing the vertices selection mechanism according to an embodiment of the present invention.

These vertices included in the shell are selected from a group of neighbor vertices. The vertices selection mechanism, as shown in FIG. 5, includes: (1) determining the normal direction of each vertex of the group of neighbor vertices, (2) determining the maximum Euclidean distance between each vertex and the other vertices, (3) using the maximum Euclidean distance as radius to determine a circumference $V_{m1}$, and (4) electing a vertex as a representing vertex of the group of neighbor vertices by merging the group of neighbor vertices with:

$$V_m(\mathrm{Max}[X_m, X_{ma}, X_{mb}, X_{mc}], \mathrm{Max}[Y_m, Y_{ma}, Y_{mb}, Y_{mc}], \mathrm{Max}[Z_m, Z_{ma}, Z_{mb}, Z_{mc}])$$

wherein $V_m$ represents the elected vertex, $X_{ma}$ satisfies $|X_m - X_{ma}| < V_{m1}$, $X_{mb}$ satisfies $|X_m - X_{mb}| < V_{m1}$, and $X_{mc}$ satisfies $|X_m - X_{mc}| < V_{m1}$. Similarly, $Y_{ma}$ satisfies $|Y_m - Y_{ma}| < V_{m1}$, $Y_{mb}$ satisfies $|Y_m - Y_{mb}| < V_{m1}$, and $Y_{mc}$ satisfies $|Y_m - Y_{mc}| < V_{m1}$. Also, $Z_{ma}$ satisfies $|Z_m - Z_{ma}| < V_{m1}$, $Z_{mb}$ satisfies $|Z_m - Z_{mb}| < V_{m1}$, and $Z_{mc}$ satisfies $|Z_m - Z_{mc}| < V_{m1}$. Here, since the value $V_{m1}$ is a vertex is selected from the outermost surface of the three-dimensional physical object, the generated $Shell_1$ represents the first layer of collision detection shell.

Next, the other layers of the shell can be generated by increase the value of $V_{m1}$. For instance, the second layer of the shell ($Shell_2$) can be generated by using the above mechanism with $V_{m2}$ instead of $V_{m1}$, wherein $V_{m2} > V_{m1}$. It is noted that since $V_{m2}$ is larger than $V_{m1}$, more vertices are merged into one, therefore, the number of vertices in $Shell_2$ is less than the number of vertices in $Shell_1$. The number of layers in the shell can be further extended with further increasing the number $V_{m2}$.

With each increase of $V_{m1}$, a new pre-collision vertex matrix is generated along the normal direction of $V_m$, resulting a new pre-collision vertex $V_n$ to have an increasing value of $(X_n, Y_n, Z_n)+(V_{m1}, V_{m1}, V_{m1})$". Therefore, the form of the shell is a multi-dimensional matrix with normals and three-dimensional coordinates representing vertices on the outer surface for collision judgment. As a result, the structure of the shell contains three-dimensional information of vertex coordinates, three-dimensional information of normal direction, $V_{m1}$ Euclidean distance representing the vertex to determine the circumference length, and information about the current number of layers.

Relation matrix acquisition step: an initial collision detection correspondence matrix is obtained according to the multi-layer and multi-surface pre-collision shell.

Here, a collision detection correspondence matrix is a mathematical representation of the generated shell above. Initial values of the collision detection correspondence matrix are from the determined shell before a collision. The number of collision can be set from 1 to m. If the three-dimensional object is a rigid body (i.e. the shape of the object is fixed), the values of the collision detection correspondence matrix stay the same after a collision. On the other hand, if the object is not a rigid body (i.e. the shape of the object deforms), the values of the collision detection correspondence matrix are updated after each collision. The update includes updating the three-dimensional coordinate information, the $V_{m1}$ distance, and the number of layers. Furthermore, a new value of $V_{m1}$ can be determined based on, but is not limited to, "average value of step size" and "non-average value of surface type". Here, a neural network is used to calculate and assign new $V_{m1}$ values.

Screening and determining step: a collision detection condition is set, a relevant parameter of the collision detection condition is input into the neural network for parameter screening, and it is determined whether a collision condition satisfies a safety condition after screening.

When the collision condition satisfies the safety condition, a collision detection correspondence matrix is not updated.

When the collision condition does not satisfy the safety condition, a current collision detection correspondence matrix is updated, and the multi-layer and multi-surface pre-collision shell constructing step is triggered according to the updated collision detection correspondence matrix to reconstruct the multi-layer and multi-surface pre-collision shell.

The neural network is used for the assigning a value for $V_{m1}$. Regarding to the value range of $V_{m1}$, the minimum value for $V_{m1}$ is the minimum adjacent distance between global vertices in the three-dimensional object, and the maximum value for $V_{m1}$ is N times the maximum adjacent distance, wherein N depends on the computing performance and Convergence Mode presets.

Neural network computations are used to speed up the decision to classify local surfaces and then provide the corresponding best-fit value for $V_{m1}$. The source of the training set is a local angle surface of a random shell model. Without considering the performance and time, the training of the neural network includes iterating calculations to convergence with the minimum adjacent distance, so that a $V_{m1}$ value where the performance and convergence tend to be stable can be obtained. The neural network is continued to be trained with new random surfaces and iterate till a corresponding best-fit $V_{m1}$ is generated. The neural network, after numerous times of training, is used to identify a trend between a type of a surface and a best-fit $V_{m1}$, thereby the determination of $V_{m1}$ can be achieved by the neural network performing classification of the type of the surface. For example, the general framework and neural network of Tensorflow or Caffe can be used, and the automatic association of surface classification and $V_{m1}$ corresponding convergence numbers can be determined by a neural network. The neural network can be implemented with different centralized network models on mobile and non-mobile terminals. Since the training data uses randomly generated surface segments, and the output is the stepping $V_{m1}$ values corresponding to the vertex positions on different surface segments, the training result data is stored in a database and used in the assignment of $V_{m1}$ when the matrix of the shell layer of the specific object modeling is updated.

With the $V_{m1}$ representing the vertices, by constructing the pre-collision vertex matrix generated near-to-far from the normal direction of the object surface, these surfaces with fewer vertices can accelerate the convergence efficiency before reaching the $Shell_1$ collision layer. All objects colliding with each other can adopt this method to speed up the convergence efficiency of collision. The basic two-sided/two-point collision determination is still the surface distance determination, which has not changed, only the representative vertex and the representative surface formed by the representative vertex have changed. For example, for two rigid bodies, or one rigid body and one non-rigid body, the conventional collision requires the distance judgment of all vertices and surfaces at all times, but the current method starts to model the collision only after the collision contact between the two parties occurs. The collision calculation and detection of different shell layers are carried out in the area. The determination starts with collisions in some parts of the $Shell_3$ layer, then the collisions that progressed to the $Shell_2$ layer, and then finally some parts of the collision that have reached the $Shell_1$ layer, until the collision convergence of $Shell_1$ is complete.

Figure 2:
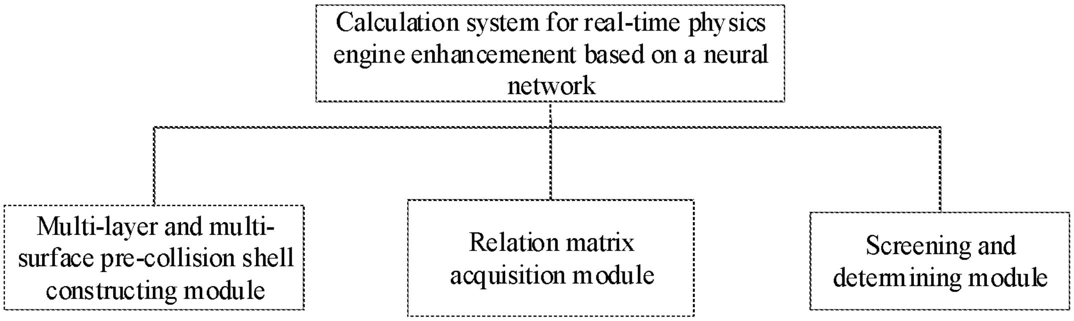
FIG. 2 schematically shows a structural framework of a calculation system for real-time physical engine enhancement based on a neural network according to an embodiment of the present invention.

Correspondingly, this embodiment also provides a calculation system for real-time physical engine enhancement based on a neural network, and its structure is schematically shown in FIG. 2. FIG. 2 schematically shows a structural framework of a calculation system for real-time physical engine enhancement based on a neural network according to an embodiment of the present invention.

As shown in FIG. 2, a calculation system for real-time physical engine enhancement based on a neural network includes a multi-layer and multi-surface pre-collision shell constructing module, a relation matrix acquisition module, and a screening and determining module. Specifically, the multi-layer and multi-surface pre-collision shell constructing module is configured to dynamically construct a multi-layer and multi-surface pre-collision shell according to key concave and convex vertices of an object to be subjected to collision detection. The relation matrix acquisition module is configured to obtain an initial collision detection correspondence matrix according to the multi-layer and multi-surface pre-collision shell. The screening and determining module is configured to set a collision detection condition, input a relevant parameter of the collision detection condition into the neural network for parameter screening, and determine whether a collision condition satisfies a safety condition after screening. When the collision condition satisfies the safety condition, a collision detection correspondence matrix is not updated. When the collision condition does not satisfy the safety condition, a current collision detection correspondence matrix is updated, and a multi-layer and multi-surface pre-collision shell constructing step is triggered according to the updated collision detection correspondence matrix to reconstruct the multi-layer and multi-surface pre-collision shell.

In this embodiment, the screening and determining step further includes the following steps.

A developing velocity of a collision and an angle in each direction are obtained by calculating a distance between objects of the collision and a time when the collision occurs to obtain vertices of the moment T after the collision occurs, and a developing displacement of vertices of the moment T+1 is deduced.

Vertices with a Euclidean distance smaller than a collision warning distance are marked and extracted to obtain marked vertices, wherein the Euclidean distance is between the vertices of the moment T and the vertices of the moment T+1.

Triangular surfaces are constructed according to the marked vertices, and triangular surfaces with a distance smaller than the collision warning distance are marked and extracted to obtain marked vertex faces, wherein the distance is between the surfaces.

The neural network is used to calculate and obtain a correspondence matrix of a distance change of each marked vertex according to a set safety distance, positions and displacements of each marked vertex at the moment T−1 and the moment T−2 before the collision occurs, and it is determined whether the distance change satisfies the warning distance. When the distance change satisfies the warning distance, it is considered that the collision condition satisfies the safety condition. When the distance change does not satisfy the warning distance, it is considered that the collision condition does not satisfy the safety condition.

In addition, it should be noted that the multi-layer and multi-surface pre-collision shell includes a first outer pre-collision shell layer, a sub-surface pre-collision shell layer, and a collision detection layer, wherein the first outer pre-collision shell layer, the sub-surface pre-collision shell layer, and the collision detection layer are arranged successively from outside to inside, and a distance between the sub-surface pre-collision shell layer and the first outer pre-collision shell layer is smaller than a distance between the collision detection layer and the first outer pre-collision shell layer.

The number of vertices and the number of surfaces of the sub-surface pre-collision shell layer are more than the number of vertices and the number of surfaces of the first outer pre-collision shell layer, and the number of vertices and the number of surfaces of the collision detection layer are more than the number of vertices and the number of surfaces of the sub-surface pre-collision shell layer.

The moment when the sub-surface pre-collision shell layer of an object is collided by vertices of the first outer pre-collision shell layer of another object is defined as the moment T, and the vertices of the first outer pre-collision shell layer of another object are defined as the vertices of the moment T.

The velocity vector of the vertices of the moment T has a velocity sub-vector moving toward the object.

Moreover, the relevant parameter of the collision detection condition includes at least one selected from the group of a collision distance, a collision velocity, a shape of a collision body, the number of surfaces of the collision body, and a safety distance.

Embodiment II

Figure 3:
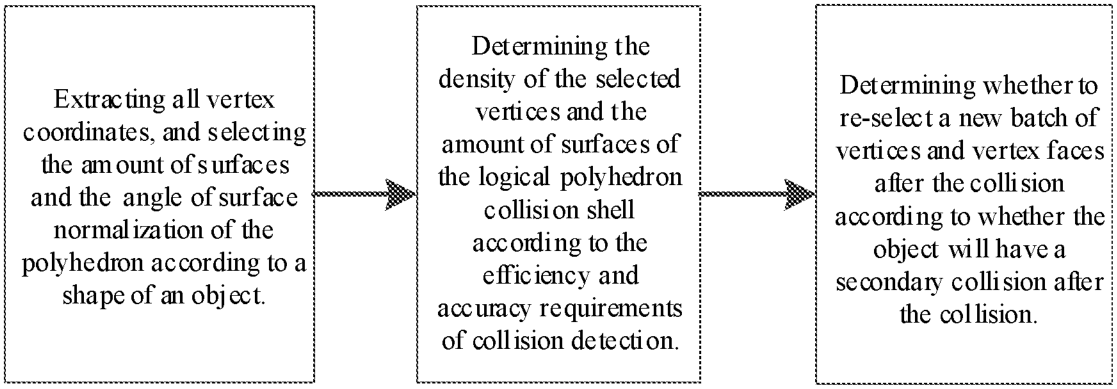
FIG. 3 schematically shows a flow chart of a calculation system for real-time physical engine enhancement based on a neural network according to an embodiment of the present invention.

FIG. 3 schematically shows a flow chart of a calculation system for real-time physical engine enhancement based on a neural network according to Embodiment II of the present invention.

As shown in FIG. 3, in this embodiment, according to the model size and shape of an object to be subjected to collision detection, a pre-collision polyhedron is generated based on the shape of the object at a current moment. However, in this case, the generated pre-collision polyhedron has a relatively small number of surfaces, and it is similar to a rough and invisible safety shell that needs to be transformed into an approximate multi-layer pre-collision body (i.e. the multi-layer and multi-surface pre-collision body in the present invention) by using a calculation method of a neural network according to the accuracy requirement. Since each object surface has two layers of safety distance, namely a maximum safety distance and a minimum safety distance, the minimum safety distance is defined as the safety distance of the first outer pre-collision shell layer. The minimum safety distance has a relatively large number of surfaces and is closer to the object surface (i.e. collision detection layer). The accuracy of collision calculation is determined by the number of surfaces of the safe distance of the sub-surface pre-collision shell layer and the angle between the normal of the surfaces. The maximum safety distance is the distance between shells of the first outer collision polyhedron. In this way, the multi-layer collision vertices and vertex faces are extracted and marked. The first outer pre-collision shell layer and the sub-surface pre-collision shell layer are obtained after the neural network extracts the surfaces of the polyhedron to be collided and performs multiple sampling calculations.

When the collision of the first outer pre-collision shell layer is not triggered between objects, the detection, scanning and calculation of the collision are not be performed according to the present invention. Before the vertices of first outer pre-collision shell layer collide the sub-surface pre-collision shell layer, the detection, scanning and calculation of the collision are also not be performed. When the vertices of first outer pre-collision shell layer collide the sub-surface pre-collision shell layer, a developing velocity of the collision is calculated according to a distance between the two shells and a time. At this time, vertices with a uniform velocity (without considering short-distance friction deceleration) are defined as the vertices of the moment T, and then the developing displacement of the vertices of the moment T+1 is deduced.

The vertex extraction, vertex displacement prediction and vertex movement velocity are all calculation variables in the neural network. For the vertex faces whose normal angle is more than 45 degrees (thus limiting the angle between the surfaces), in the vertex displacement prediction, it is necessary to decompose the velocity into components along three coordinate axes to obtain a more accurate displacement prediction.

After the sub-surface pre-collision shell layer is collided, the collision enters the collision detection layer. The collision detection layer is composed of the number of surfaces and the number of vertices of real objects of 1/10-2/10 of irregular objects having more than 500 vertices and surfaces. Moreover, the detection of the object surface (that is, the collision detection layer) composed of the non-uniform points will be regarded as the result of collision detection.

It should be noted that the collision, vertex selection and point displacement estimation between the first outer pre-collision shell layer, the sub-surface pre-collision shell layer and the collision detection layer are all calculated by using the neural network. The sampling, convolution, normalization, weight and Election and Recommendation algorithm that may be involved in the calculation process are all known to those skilled in the art, and are not described repeatedly herein.

When two objects reciprocate and repeatedly collide between the collision detection layer and the sub-surface pre-collision shell layer, the velocity between the two surfaces is updated as the velocity between the two objects. Hence, before the collision detection occurs, there exists a collision detection correspondence matrix between each object and all objects that are likely to be collided in the space of the coordinate system. The group of collision detection correspondence matrices will be processed provided that the safety collision of the first outer pre-collision shell layer occurs.

The above collision detection correspondence matrix and the decomposition can be calculated according to the Euclidean distance mathematical method, and the specific calculation process is known to those skilled in the art, and is not described repeatedly herein.

It should be noted that if an object is deformed after a single collision between objects, it is necessary to reconstruct a new multi-layer and multi-surface pre-collision shell according to the neural network because the vertices of the real object will change permanently. The reconstructing step thereof can be referred to the multi-layer and multi-surface pre-collision shell constructing step.

After the collision between objects occurs, if the collision occurs twice, the collision detection correspondence matrix needs to be updated to recalculate the collision condition. The collision condition is calculated provided that the safety collision of the first outer pre-collision shell layer is triggered.

In this embodiment, the definition of the safety distance is alterable. For a single collision, the safety distance is within the first outer pre-collision shell layer, and the corresponding calculation of the collision and distance relationship is not initiated outside the distance. For multiple collisions, the safety distance means a pre-collision of the first outer pre-collision shell layer and the sub-surface pre-collision shell layer. The multiple collisions involve normal decomposition, angle decomposition, prediction of velocity of vertices under the sub-surface, and the calculations of vertex displacement and vertex selection of the sub-surface and the collision surface that are caused by the displacement of vertices of the deformed surface.

It should be pointed out that the collision accuracy and density, whether it is multiple collisions and whether the deformation occurs after the collision are all the parameters capable of affecting the occurrence of the collision. Therefore, the shape and the detection density of the real object are one of the factors considered in the present invention.

In addition, the accuracy requirement refers to the definition of the number of collision surfaces colliding the object and the density of vertex selection, that is, the requirement for the collision accuracy.

An appropriate neural network is established by the collision mode in which the vertices and the vertex faces have the specified mode of motion and velocity. The appropriate neural network is configured to screen the collision vertex model data set so as to accelerate the collision vertex screening of similar objects.

Considering that the settings of collision distance and velocity, shape and surface number of collision body and safety distance are all related to the final calculation results, a suitable classified collision distance matrix is established according to the above conditions, and is used in the calculation of dynamic real-time collision detection deducing.

It should be noted that the above deducing process may be performed by a hierarchical calculation of a standard neural network, and the calculation object is the vertex. Classification and selection are used to calculate the corresponding matrix adopting the movement of fixed points and vertices and the angle decomposition, so as to achieve an efficient network pre-calculation and calculation process.

During the process, Euclidean distance dispersion, vector three-dimensional coordinate system decomposition calculation, matrix normalization selection, relation matrix convolution, eigenvector sampling and other involved calculation processes belong to the calculation methods known to those skilled in the art, and thus are not described repeatedly herein.

Figure 4:
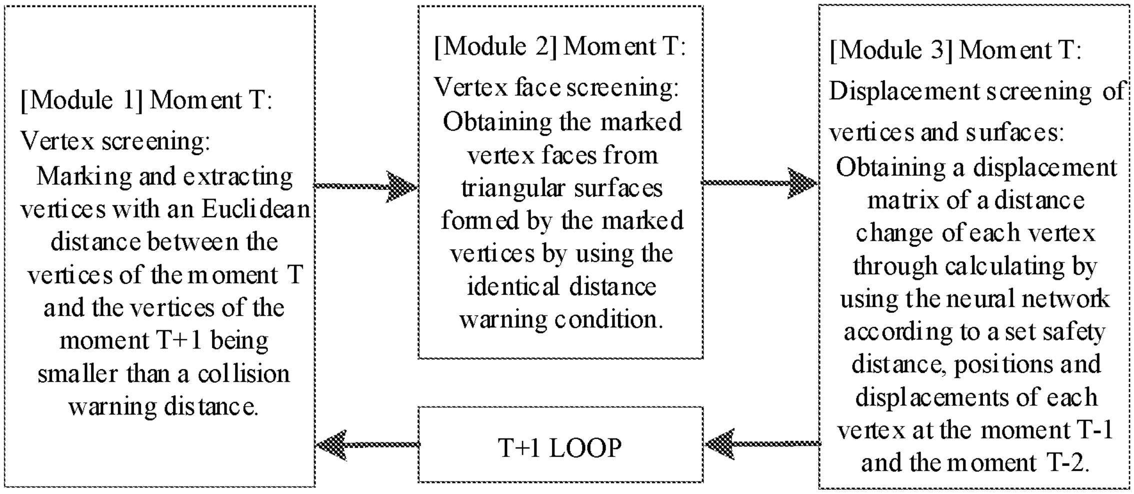
FIG. 4 schematically shows a screening and determining step of a calculation system for real-time physical engine enhancement based on a neural network according to an embodiment of the present invention.

FIG. 4 schematically shows a screening and determining step of a calculation system for real-time physical engine enhancement based on a neural network according to another embodiment of the present invention.

As shown in FIG. 4, in this embodiment, the screening and determining step includes the following steps. A developing velocity of a collision and an angle in each direction are obtained by calculating a distance between objects of the collision and a time when the collision occurs to obtain vertices of the moment T after the collision occurs. A developing displacement of vertices of the moment T+1 is deduced. Vertices with a Euclidean distance smaller than a collision warning distance are marked and extracted to obtain marked vertices, wherein the Euclidean distance is between the vertices of the moment T and the vertices of the moment T+1. Triangular surfaces are constructed according to the marked vertices, and triangular surfaces with a distance smaller than the collision warning distance are marked and extracted to obtain marked vertex faces, wherein the distance is between the surfaces. A correspondence matrix of a distance change of each marked vertex is obtained and calculated by using the neural network according to a set safety distance, positions and displacements of each marked vertex at the moment T−1 and the moment T−2 before the collision occurs, and it is determined whether the distance change satisfies the warning distance. When the distance change satisfies the warning distance, it is considered that the collision condition satisfies the safety condition. When the distance change does not satisfy the warning distance, it is considered that the collision condition does not satisfy the safety condition.

For those skilled in the art, the system and its devices, modules and units provided by the present invention is achieved by means of a pure computer-readable program code, and also, the steps of the method of the present invention may be logically programmed to enable the system and its devices, modules and units provided by the present invention to achieve the same function in the form of logic gates, switches, application-specific integrated circuits, programmable logic controllers, embedded microcontrollers and the likes. Therefore, the system and its devices, modules and units provided by the present invention may be regarded as a hardware component, and the devices, modules and units included in the system to realize various functions may also be regarded as the structures in the hardware component. The devices, modules and units used to realize various functions may also be regarded as both the software modules of the implementation method and the structures in the hardware component.

It should be noted that the content of the prior art in the scope of protection of the present invention is not limited to the embodiments given in this application document, and all prior arts that do not contradict the solutions of the present invention, including, but not limited to, prior patent documents, prior public publications, prior public use and others shall fall within the scope of protection of the present invention.

In addition, the combination of the technical features in the present invention is not limited to the combination recorded in the claim or the combination recorded in the specific embodiment, and all the technical features recorded in the present invention may be freely combined in any way, unless there is a contradiction therebetween.

It should also be noted that the embodiments listed above are only specific embodiments of the present invention. It is obvious that the present invention is not limited to the above embodiments. Other similar changes or deformations that may be directly derived or easily associated by those skilled in the art from the contents disclosed by the present invention all shall fall within the scope of protection of the present invention.

Specific embodiments of the present invention are described above. It should be understood that the present invention is not limited to the aforementioned specific embodiments. Those skilled in the art may make various changes or modifications within the scope of the claim, which does not affect the substance of the present invention. Without conflict, the embodiments and the features of embodiments of the present invention may be arbitrarily combined with each other.

What is claimed is:

1. A calculation method for a real-time physical engine enhancement based on a neural network, executed by at least one processor and a memory, comprising the following steps:

a multi-layer and multi-surface pre-collision shell constructing step: dynamically constructing, by the processor, a multi-layer and multi-surface pre-collision shell data structure stored in the memory, the pre-collision shell comprising a plurality of three-dimensional matrices corresponding to concave and convex surface vertices of an object to be subjected to collision detection;

wherein the constructing of the pre-collision shell further comprises: determining, for a group of neighboring vertices, a Euclidean distance threshold Vm1 based on a maximum Euclidean distance between vertices in the group, and merging vertices within the Euclidean distance threshold Vm1 into a representative vertex such that a plurality of neighboring vertices are reduced to a reduced number of representative vertices to form a first-layer pre-collision shell;

wherein additional shell layers are generated by increasing the Euclidean distance threshold to Vm2 greater than Vm1 to merge a greater number of vertices, thereby forming a multi-layer structure having progressively reduced vertex density;

a relation matrix acquisition step: obtaining, by the processor, an initial collision detection correspondence matrix representing Euclidean distance relationships between vertices of the multi-layer and multi-surface pre-collision shell; and a screening and determining step: setting a collision detection condition, inputting, by the processor, one or more collision parameters including vertex distance change, surface type, and relative velocity into a trained neural network stored in the memory, and determining whether a collision condition satisfies a safety condition after screening;

wherein the trained neural network generates an output Vm1 value indicating whether a predicted vertex-to-vertex distance change violates a predefined safety distance;

wherein when the collision condition satisfies the safety condition, the collision detection correspondence matrix is maintained without update;

when the collision condition does not satisfy the safety condition, the collision detection correspondence matrix is updated based on the output of the trained neural network;

the multi-layer and multi-surface pre-collision shell constructing step is selectively triggered according to the updated collision detection correspondence matrix to reconstruct the multi-layer and multi-surface pre-collision shell;

wherein selective reconstruction reduces real-time collision-detection computation relative to reconstructing the pre-collision shell at every simulation time step; and wherein the trained neural network is trained by: generating a training dataset comprising a plurality of surface segments of objects having different surface types and geometries; iteratively calculating candidate Euclidean distance threshold values Vm1 corresponding to vertex groupings of the surface segments; performing convergence-based optimization to determine a best-fit Euclidean distance threshold Vm1 associated with each surface type; and training the neural network to learn a relationship between surface characteristics and corresponding best-fit Euclidean distance threshold values such that the trained neural network outputs an assigned Vm1 for use in constructing the pre-collision shell.

2. The calculation method for the real-time physical engine enhancement based on the neural network of claim 1, wherein the screening and determining step comprises the following steps:

obtaining a developing velocity of a collision and an angle in each direction by calculating a distance between objects of the collision and a time when the collision occurs to obtain vertices of a moment T after the collision occurs, and deducing a developing displacement of vertices of a moment T+1;

marking and extracting vertices with a Euclidean distance smaller than a collision warning distance to obtain marked vertices, wherein the Euclidean distance is between the vertices of the moment T and the vertices of the moment T+1;

constructing triangular surfaces according to the marked vertices, and marking and extracting triangular surfaces with a distance smaller than the collision warning distance to obtain marked vertex faces, wherein the distance is between the surfaces; and using the neural network to calculate and obtain a correspondence matrix of a distance change of each marked vertex according to a set safety distance, positions and displacements of each marked vertex at the moment T−1 and the moment T−2 before the collision occurs, and determining whether the distance change satisfies the warning distance; wherein when the distance change is larger than the warning distance, the collision condition satisfies the safety condition; when the distance change is smaller than or equal to the warning distance, the collision condition does not satisfy the safety condition.

3. The calculation method for the real-time physical engine enhancement based on the neural network of claim 2, wherein the multi-layer and multi-surface pre-collision shell comprises a first outer pre-collision shell layer, a sub-surface pre-collision shell layer, and a collision detection layer, wherein the first outer pre-collision shell layer, the sub-surface pre-collision shell layer, and the collision detection layer are arranged successively from outside to inside, and a distance between the sub-surface pre-collision shell layer and the first outer pre-collision shell layer is smaller than a distance between the collision detection layer and the first outer pre-collision shell layer;

the number of vertices and the number of surfaces of the sub-surface pre-collision shell layer are more than the number of vertices and the number of surfaces of the first outer pre-collision shell layer, and the number of vertices and the number of surfaces of the collision detection layer are more than the number of vertices and the number of surfaces of the sub-surface pre-collision shell layer;

a moment when the sub-surface pre-collision shell layer of an object is collided by vertices of the first outer pre-collision shell layer of another object is defined as the moment T, and the vertices of the first outer pre-collision shell layer of another object are defined as the vertices of the moment T; and a velocity vector of the vertices of the moment T has a velocity sub-vector moving toward the object.

4. The calculation method for the real-time physical engine enhancement based on the neural network of claim 1, wherein the relevant parameter of the collision detection condition comprises at least one selected from the group of a collision distance, a collision velocity, a shape of a collision body, a number of surfaces of the collision body, and a safety distance.

5. A non-transitory computer-readable storage medium, wherein a computer program is stored in the computer-readable storage medium; the computer program is configured to be processed and executed to implement the steps of the calculation method for the real-time physical engine enhancement based on the neural network of claim 1.

6. The computer-readable storage medium of claim 5, wherein the screening and determining step comprises:

obtaining a developing velocity of a collision and an angle in each direction by calculating a distance between objects of the collision and a time when the collision occurs to obtain vertices of a moment T after the collision occurs, and deducing a developing displacement of vertices of a moment T+1;

marking and extracting vertices with a Euclidean distance smaller than a collision warning distance to obtain marked vertices, wherein the Euclidean distance is between the vertices of the moment T and the vertices of the moment T+1;

constructing triangular surfaces according to the marked vertices, and marking and extracting triangular surfaces with a distance smaller than the collision warning distance to obtain marked vertex faces, wherein the distance is between the surfaces; and using the neural network to calculate and obtain a correspondence matrix of a distance change of each marked vertex according to a set safety distance, positions and displacements of each marked vertex at the moment T−1 and the moment T−2 before the collision occurs, and determining whether the distance change satisfies the warning distance; wherein when the distance change is larger than the warning distance, the collision condition satisfies the safety condition; when the distance change is smaller than or equal to the warning distance, the collision condition does not satisfy the safety condition.

7. The computer-readable storage medium of claim 6, wherein the multi-layer and multi-surface pre-collision shell comprises a first outer pre-collision shell layer, a sub-surface pre-collision shell layer, and a collision detection layer, wherein the first outer pre-collision shell layer, the sub-surface pre-collision shell layer, and the collision detection layer are arranged successively from outside to inside, and a distance between the sub-surface pre-collision shell layer and the first outer pre-collision shell layer is smaller than a distance between the collision detection layer and the first outer pre-collision shell layer;

the number of vertices and the number of surfaces of the sub-surface pre-collision shell layer are more than the number of vertices and the number of surfaces of the first outer pre-collision shell layer, and the number of vertices and the number of surfaces of the collision detection layer are more than the number of vertices and the number of surfaces of the sub-surface pre-collision shell layer;

a moment when the sub-surface pre-collision shell layer of an object is collided by vertices of the first outer pre-collision shell layer of another object is defined as the moment T, and the vertices of the first outer pre-collision shell layer of another object are defined as the vertices of the moment T; and a velocity vector of the vertices of the moment T has a velocity sub-vector moving toward the object.

8. The computer-readable storage medium of claim 5, wherein the relevant parameter of the collision detection condition comprises at least one selected from the group of a collision distance, a collision velocity, a shape of a collision body, a number of surfaces of the collision body, and a safety distance.

9. A calculation system for real-time physical engine enhancement based on a neural network, comprising:

a processor, and a memory storing computer readable instructions configured to be executed by the processor, wherein the computer readable instructions, when executed by the processor, cause the processor to:

dynamically construct a multi-layer and multi-surface pre-collision shell data structure stored in the memory, the pre-collision shell comprising a plurality of three-dimensional matrices corresponding to concave and convex surface vertices of an object to be subjected to collision detection;

wherein the constructing of the pre-collision shell further comprises: determining, for a group of neighboring vertices, a Euclidean distance threshold Vm1 based on a maximum Euclidean distance between vertices in the group, and merging vertices within the Euclidean distance threshold Vm1 into a representative vertex such that a plurality of neighboring vertices are reduced to a reduced number of representative vertices to form a first-layer pre-collision shell;

wherein additional shell layers are generated by increasing the Euclidean distance threshold to Vm2 greater than Vm1 to merge a greater number of vertices, thereby forming a multi-layer structure having progressively reduced vertex density;

obtain an initial collision detection correspondence matrix representing Euclidean distance relationships between vertices of the multi-layer and multi-surface pre-collision shell; and set a collision detection condition, input one or more collision parameters including vertex distance change, surface type, and relative velocity into a trained neural network stored in the memory, and determine whether a collision condition satisfies a safety condition after screening;

wherein the trained neural network generates an output indicating whether a predicted vertex-to-vertex distance change violates a predefined safety distance;

wherein when the collision condition satisfies the safety condition, the collision detection correspondence matrix maintained without update;

when the collision condition does not satisfy the safety condition, the collision detection correspondence matrix is updated based on the output of the trained neural network;

the multi-layer and multi-surface pre-collision shell constructing step is selectively triggered according to the updated collision detection correspondence matrix to reconstruct the multi-layer and multi-surface pre-collision shell;

wherein selective reconstruction reduces real-time collision-detection computation relative to reconstructing the pre-collision shell at every simulation time step; and wherein the trained neural network is trained by: generating a training dataset comprising a plurality of surface segments of objects having different surface types and geometries: iteratively calculating candidate Euclidean distance threshold values Vm1 corresponding to vertex groupings of the surface segments: performing convergence-based optimization to determine a best-fit Euclidean distance threshold Vm1 associated with each surface type; and training the neural network to learn a relationship between surface characteristics and corresponding best-fit Euclidean distance threshold values such that the trained neural network outputs an assigned Vm1 for use in constructing the pre-collision shell.

10. The calculation s stem for the real-time physical engine enhancement based on the neural network of claim 9, wherein the processor is further configured to:

obtain a developing velocity of a collision and an angle in each direction by calculating a distance between objects of the collision and a time when the collision occurs to obtain vertices of a moment T after the collision occurs, and deduce a developing displacement of vertices of a moment T+1;

mark and extract vertices with a Euclidean distance smaller than a collision warning distance to obtain marked vertices, wherein the Euclidean distance is between the vertices of the moment T and the vertices of the moment T+1;

construct triangular surfaces according to the marked vertices, and mark and extract triangular surfaces with a distance smaller than the collision warning distance to obtain marked vertex faces, wherein the distance is between the surfaces; and use the neural network to calculate and obtain a correspondence matrix of a distance change of each marked vertex according to a set safety distance, positions and displacements of each marked vertex at the moment T−1 and the moment T−2 before the collision occurs, and determine whether the distance change satisfies the warning distance; wherein when the distance change is larger than the warning distance, the collision condition satisfies the safety condition; when the distance change is smaller than or equal to the warning distance, the collision condition does not satisfy the safety condition.

11. The calculation system for the real-time physical engine enhancement based on the neural network of claim 10, wherein the number of vertices and the number of surfaces of the sub-surface pre-collision shell layer are more than the number of vertices and the number of surfaces of the first outer pre-collision shell layer, and the number of vertices and the number of surfaces of the collision detection layer are more than the number of vertices and the number of surfaces of the sub-surface pre-collision shell layer;

a moment when the sub-surface pre-collision shell layer of an object is collided by vertices of the first outer pre-collision shell layer of another object is defined as the moment T, and the vertices of the first outer pre-collision shell layer of another object are defined as the vertices of the moment T; and a velocity vector of the vertices of the moment T has a velocity sub-vector moving toward the object.

12. The calculation system for the real-time physical engine enhancement based on the neural network of claim 9, wherein the multi-layer and multi-surface pre-collision shell comprises a first outer pre-collision shell layer, a sub-surface pre-collision shell layer, and a collision detection layer, wherein the first outer pre-collision shell layer, the sub-surface pre-collision shell layer, and the collision detection layer are arranged successively from outside to inside, and a distance between the sub-surface pre-collision shell layer and the first outer pre-collision shell layer is smaller than a distance between the collision detection layer and the first outer pre-collision shell layer.

13. The calculation system for the real-time physical engine enhancement based on the neural network of claim 9, wherein the relevant parameter of the collision detection condition comprises at least one selected from the group of a collision distance, a collision velocity, a shape of a collision body, a number of surfaces of the collision body, and a safety distance.

* * * * *